United States Patent [19]

Koontz

[11] Patent Number: 5,115,215
[45] Date of Patent: May 19, 1992

[54] PIN DIODE ACTIVATION METHOD AND APPARATUS

[75] Inventor: Floyd A. Koontz, Holcomb, N.Y.

[73] Assignee: Harris Corporation, Melbourne, Fla.

[21] Appl. No.: 599,464

[22] Filed: Oct. 18, 1990

[51] Int. Cl.⁵ .............................................. H01P 1/15
[52] U.S. Cl. .................................. 333/103; 333/262; 307/259; 363/89
[58] Field of Search ............... 333/101, 103, 104, 126, 333/129, 132, 262; 307/241, 256, 259; 363/89, 126

[56] References Cited

U.S. PATENT DOCUMENTS

| | | | |
|---|---|---|---|
| 4,486,722 | 12/1984 | Landt | 307/259 X |
| 4,486,723 | 12/1984 | Lysobey | 333/17.3 |
| 4,502,025 | 2/1985 | Carl, Jr. et al. | 333/24 R |

*Primary Examiner*—Eugene R. LaRoche
*Assistant Examiner*—Seung Ham
*Attorney, Agent, or Firm*—Rogers & Killeen

[57] ABSTRACT

A method and apparatus for activating PIN diodes. The PIN diodes are formed as a switch around terminals of another device. When the PIN diodes are made conductive, they shunt the terminals of the device, operatively by-passing the device. The PIN diodes are made conductive by RF signals which selectively provide a bias level to the PIN diodes.

6 Claims, 5 Drawing Sheets

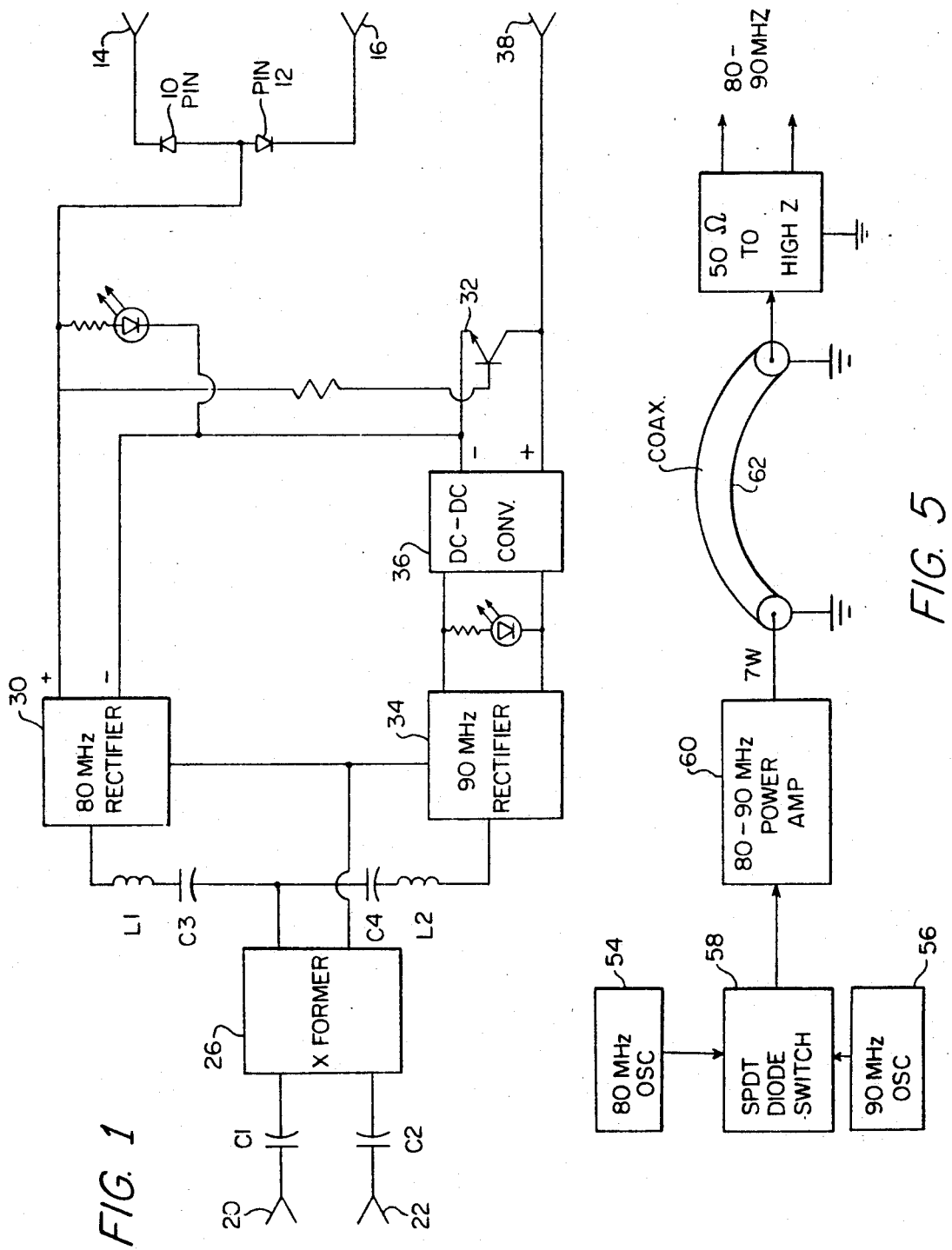

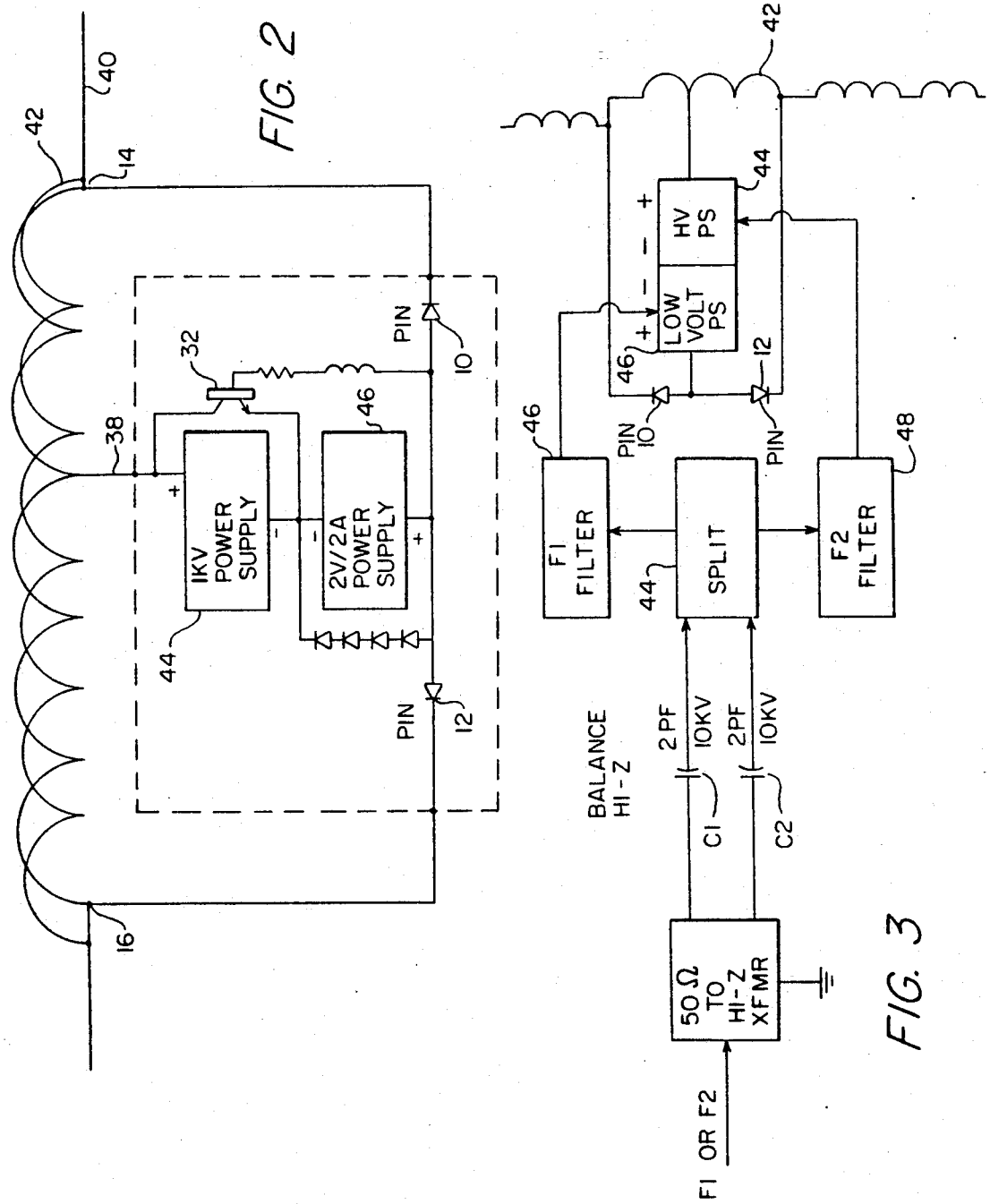

PIN DIODE ACTIVATION METHOD AND APPARATUS

BACKGROUND OF THE INVENTION

The present invention relates to a method and apparatus for switching electronic components into or out of a Radio Frequency (RF), circuit and particularly to a method and apparatus for activating Positive Intrinsic Negative (PIN) diodes.

It is well known in the field of electronics to use one or more diodes to act as switches. By the proper application of a biasing voltage, diodes can be made to conduct or inhibit conduction of RF signals. In such systems, it is frequently desirable that the circuitry which controls the activation and deactivation of the diodes not interfere or otherwise affect the RF being signal communicated.

Often it is desired to use PIN diodes to switch components carrying signals having RF frequencies and high power. The switching of such signals often provides an additional problem of isolation in that the RF energy present in the signal may destructively overload the drive circuits for the PIN diodes. While inductors and chokes have been used for isolation purposes in such circumstances for some RF signals, the use of such inductors in close proximity to the RF signals often results in an unacceptable degradation of the RF signal. Moreover, chokes for signals of high power in the 1.5 to 30 MHz frequency range are generally not practical.

To provide additional isolation, it is known to feed the control wires of the PIN diode drive circuit through a piece of copper tubing which forms the inductive elements of the RF circuit. See, for example, U.S. Pat. No. 4,502,025 to Carl, Jr., et al. The control wires for a particular inductor are withdrawn from the interior of the inductor adjacent its mid-point so that the control wire is at the same RF potential as the inductor being controlled and the circuit is not thereby overloaded. Use of the interiorly disposed control wires presents some difficulties, however, in that there is insufficient room for the many wires in the interior which must be stuffed when many different coils are desired.

It is accordingly an object of the present invention to provide a novel method and apparatus for selectively activating PIN diodes, particularly when the diodes are thousands of RF volts above ground level.

It is another object of the present invention to provide a novel method and apparatus for activating PIN diodes without unnecessary interference in an RF signal being communicated in the associated circuitry.

It is still another object of the present invention to provide a novel method and apparatus for selectively activating electronic elements at high RF voltages without the need for tubing to isolate the control lines.

It is yet another object of the present invention to provide a novel method and apparatus for activating PIN diodes operating at high RF voltages with relatively minor additional stray capacitance in the circuitry.

It is still a further object of the present invention to provide a novel method and apparatus which utilizes VHF power to switch PIN diodes with a relatively high isolation and relatively low capacitance.

These and many other objects and advantages of the present invention will be readily apparent to one skilled in the RF signal art from the claims and from the following detailed description when read in conjunction with the appended drawings.

BRIEF DESCRIPTION OF THE DRAWINGS

FIG. 1 is a schematic circuit diagram illustrating a circuit for selectively activating PIN diodes in accordance with the present invention;

FIG. 2 is a schematic circuit diagram illustrating another embodiment of the present invention used to switch a coil in and out of a circuit;

FIG. 3 is a schematic circuit diagram of another embodiment of the invention in use to switch a portion of a tuning coil in or out of a circuit;

FIG. 5 is a schematic circuit diagram of a drive source which may be used in a circuit of the present invention;

DETAILED DESCRIPTION OF THE PREFERRED EMBODIMENTS

Figure 4:
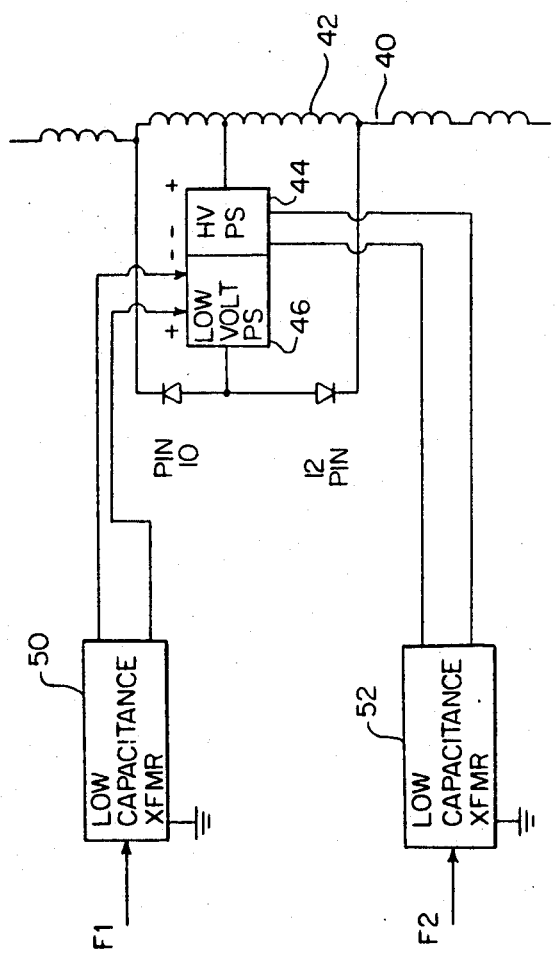
FIG. 4 is a schematic circuit diagram of another embodiment of the present invention used to switch a tuning coil in and out of a circuit.

With reference to FIG. 1, a PIN diode switch of the present invention may include PIN diodes 10 and 12 formed as a switch around terminals 14 and 16. When the PIN diodes are made conductive, they form a shunt across the terminals 14 and 16, operatively by-passing whatever electronic elements may be otherwise connected between terminals 14 and 16. When the PIN diodes 10 and 12 are made nonconductive, signals being transmitted from terminal 14 to terminal 16 must communicate through whatever elements are connecting terminals 14 and 16. Thus, the PIN diodes can be said to switch in and out of the circuit whatever elements (not shown) are between the terminals 14 and 16.

Control of the PIN diode switch of FIG. 1 desirably includes input terminals 20 and 22, each of which is connected respectively to capacitors C1 and C2. The capacitors C1 and C2 are in turn connected to a transformer which transforms high impedance input signals to a lower impedance, such as 50 ohms, used in the activation circuit. The signals arriving at the transformer are provided on one hand to a filter comprising a capacitor C3 and an inductor L1 and to a second filter comprising capacitor C4 and inductor L2. The signals passing through the first filter operate a power source, such as a rectifier 30, which is connected to the anodes of both PIN diodes 10 and 12. Additionally, the rectifier 30 is connected to the emitter of a transistor 32. Signals passing through the second filter (C4, L2) are provided to a second rectifier 34 which when operating provides a DC voltage signal to a DC-DC converter, which is, in turn, connected both to the emitter of the transistor 32 and to the terminal 38.

In operation, the filters and associated rectifiers 30, 34 respond to signals of particular frequencies for providing an associated bias level to the PIN diodes 10 and 12. For example, the rectifier 30 may be responsive to an 80 Mhz signal and the second rectifier 34 may be responsive to a different frequency signal, such as a 90 Mhz signal. To operate the PIN diodes, a signal of either 80 Mhz is applied to the circuit, preferably through terminal 20, or a signal of 90 Mhz is applied to the circuit, preferably through terminal 22. In the case of the 80 Mhz signal being applied, the signal passes through the capacitor C1 and the transformer 26 and is passed through the first filter to the 80 Mhz rectifier 30. The 80 Mhz rectifier 30 operates to provide a biasing signal to the PIN diodes 10, 12. For example, in the circuit of FIG. 1, the rectifier applies a forward bias to the PIN diodes 10, 12.

With continued reference to FIG. 1, if a 90 Mhz signal is supplied to the circuit, it will pass through the capacitor C2, the transformer 26, and the second filter (capacitor C4 and inductor L2) to the 90 Mhz rectifier 34. This rectifier, which is responsive to 90 Mhz signals, will produce a DC signal which may then be converted to a higher voltage by the DC to DC converter 36. The voltage signal out of the DC to DC converter is applied to bias the PIN diodes 10, 12. Note that in the circuit of FIG. 1, the biasing signal associated with the 90 Mhz rectifier 34 is a reverse bias on the PIN diodes 10, 12.

In operation, the 80 Mhz signal provided to the circuit of FIG. 1 may be a signal having a characteristic impedance of 50 ohms and having approximately 5 watts of RF power. From this signal, the rectifier 30 generates a signal of approximately two volts and approximately two amps. The 90 Mhz signal may also be a 50 ohm characteristic impedance signal of approximately 2 watts which results in a DC signal of approximately 12 to 15 volts out of the rectifier 34, which is then converted by the DC to DC converter 36 to a signal of approximately 1 kilovolt. The capacitors C1 and C2 may be two picofarad capacitors.

Transistor 32 serves to insure that both the 80 Mhz rectifier 30 and the 90 Mhz rectifier 34 do not attempt to control the diode activation at the same time. In operation, the 80 Mhz rectifier 30 will effectively short the power supplied by the 90 Mhz rectifier whenever the 80 Mhz rectifier is operating.

With reference now to FIG. 2, the PIN diode activation circuit of the present invention may be used to switch a coil into and out of an electric circuit. The PIN diodes 10 and 12 are connected as described in association with a circuit in FIG. 1. The cathodes of the diodes are each connected to one of the ends of a coil 42 at the terminals 14 and 16. As shown, the circuit is used to shunt the entirety of the coil and remove it effectively from the circuit which is represented by circuit line 40. Alternatively, the terminals 14, 16 could be connected at locations within the coil to lower the effective length of the coil and, accordingly, alter its level of induction. The terminal 38 may be connected to the center tap of the coil 42 to establish the activation circuit at approximately the midpoint of the RF potential across the coil 42.

With continued reference to FIG. 2, a 1 kilovolt power supply 44 performs the same function as the 90 Mhz rectifier of FIG. 1, i.e., reverse biasing the PIN diodes 10, 12. A 2V/2A power supply 46 serves the same function as the 80 Mhz rectifier 30 in the circuit FIG. 1, i.e., providing a forward bias to the PIN diodes switch 10, 12. Not shown in the circuit of FIG. 2 are the filter and isolation transformers of the circuit, it being understood that the two power supplies 44 and 46 are alternately energized responsively to an input signal which operates the power supplies in a binary fashion.

With reference to FIG. 3, a generalized circuit in accordance with the present invention is depicted shunting a portion of the coil 42. The PIN diode activation circuit is responsive to two frequencies, F1 and F2. After passing the isolating capacitors C1 and C2, the input signal (F1 or F2) is split by a splitter 44 and applied to both a filter responsive to frequency of F1 46 and a filter responsive to a frequency of F2 48. The F1 filter 46 passes acceptable signals to cause the energization of the low voltage power supply 46 which will forward bias the PIN diodes 10, 12. A signal passing through the F2 filter 48 will cause the energization of the high voltage power supply 44 which provides a reverse bias to the PIN diodes 10, 12. The power supplies may be floated to the center of the coil, thereby operating without a ground reference and the switching of the PIN diodes is accomplished substantially above ground, as the RF signal passing through the coil 42 may have a potential of many thousands of volts.

With reference to FIG. 4, an alternative embodiment of the present invention may eliminate the use of the frequency splitters (as used in the circuits described above) by providing the VHF signals having a frequency of either F1 or F2 to low capacitance transformers 50 and 52. The low capacitance transformers 50 and 52 in turn drive the low volt power supply 46 and the high volt power supply 44 to operate as has been previously described in reference to the circuits of FIGS. 1 through 3. With the circuit of FIG. 4, the frequency of the VHF signals F1 and F2 can be the same or different.

With reference to FIG. 5, as used in the circuits of FIGS. 1 through 4, the drive source may be a circuit which contains oscillators at the selected frequencies, such as an 80 Mhz oscillator 54 and a 90 Mhz oscillator 56. The output signals from each of the oscillators 54 and 56 are provided to a signal pole-double throw diode switch 58 which applies one of the oscillator signals its output terminal. The signal output from the diode switch 58 is amplified through a power amp 60, operative in the 80 through 90 Mhz range, and producing approximately 7 watts of RF power. Coaxial cable 62 may be used to provide the drive source signal to the PIN diode switch. The use of 80 to 90 Mhz signals is arbitrary but it has been found that these signals provide a minimum amount of interference with operational frequencies or with other frequencies which it is desired to avoid. In most RF communication applications, the 80 to 90 Mhz signals even if leaked through other elements of the system and ultimately radiated will cause a minimum of objectionable interference.

With continued reference to FIG. 5, the logic for controlling the state of the diode switch 58 may be obtained from a conventional agile tuning logic or any digital logic in which there is a desire to operate a switch in a binary manner. Although a signal for a single pole-double throw switch 58 is indicated, a further application of the present invention may include the option to operate when the switch is in a third position, i.e., not tied to either oscillator 54 or oscillator 56, and the "no signal" can be used by the PIN diode switches to indicate another selection of switch states.

Figure 6:
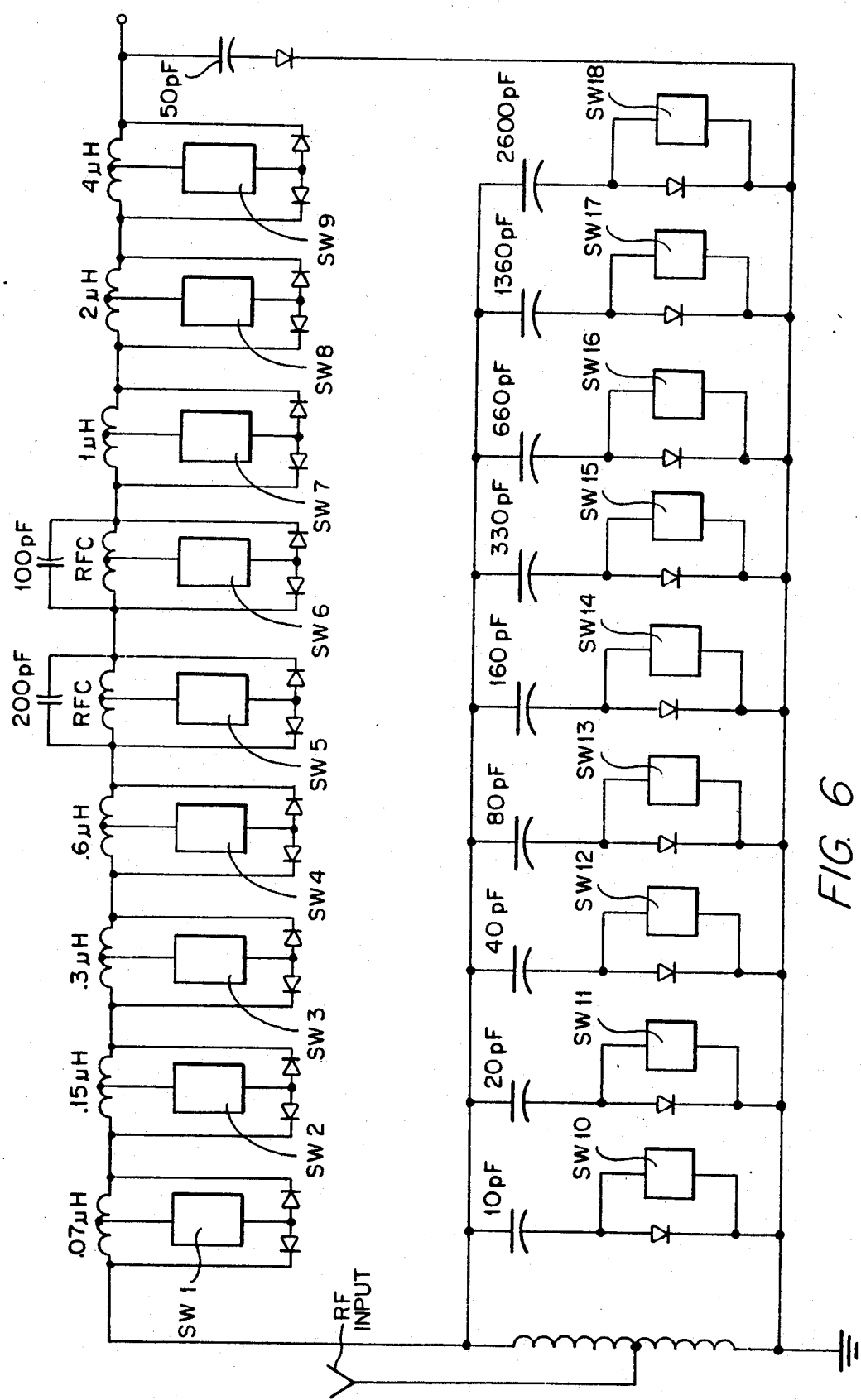
FIG. 6 is a schematic circuit diagram of an agile tuning network which utilizes the PIN diode activation technique of the present invention.

With reference to FIG. 6, the PIN diode activation technique of the present invention finds particular utility in an antenna coupler RF network. The antenna coupler network comprises plural inductive and capacitive elements of varying values which may be selectively combined to form an antenna coupler. The inclusion or exclusion of the particular element of the network in the ultimate circuit is accomplished by the PIN diode switches, SW1-SW18. By selectively operating the switches SW1-SW18, each of the circuit elements associated with the switch may be brought in or out of the operative circuit. As can be seen in the circuit of FIG. 6, the power supplies of each of the switches S1-S9 associated with the inductors are at the potential of their associated inductors. This permits the power supplies to operate at the virtual ground of the circuit with which it is associated.

Figure 7:
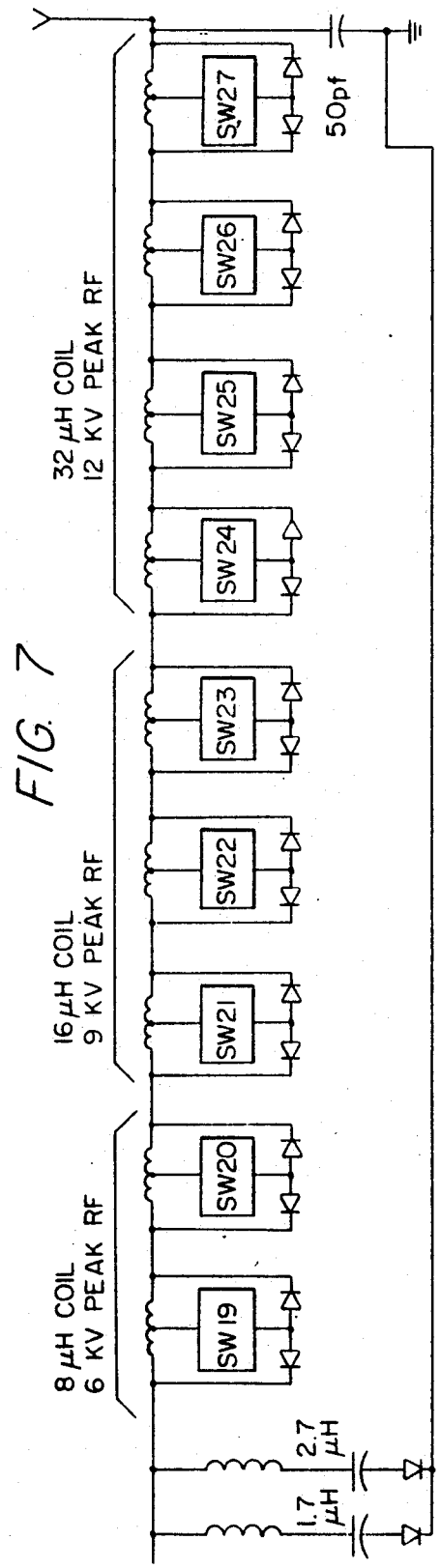
FIG. 7 is a schematic circuit diagram of another RF network which uses the present invention to activate the PIN diodes.

With reference to FIG. 7, PIN diode switches of the present invention may be utilized with another embodiment of an agile antenna coupler or network circuit as depicted in FIG. 7.

Figure 8:
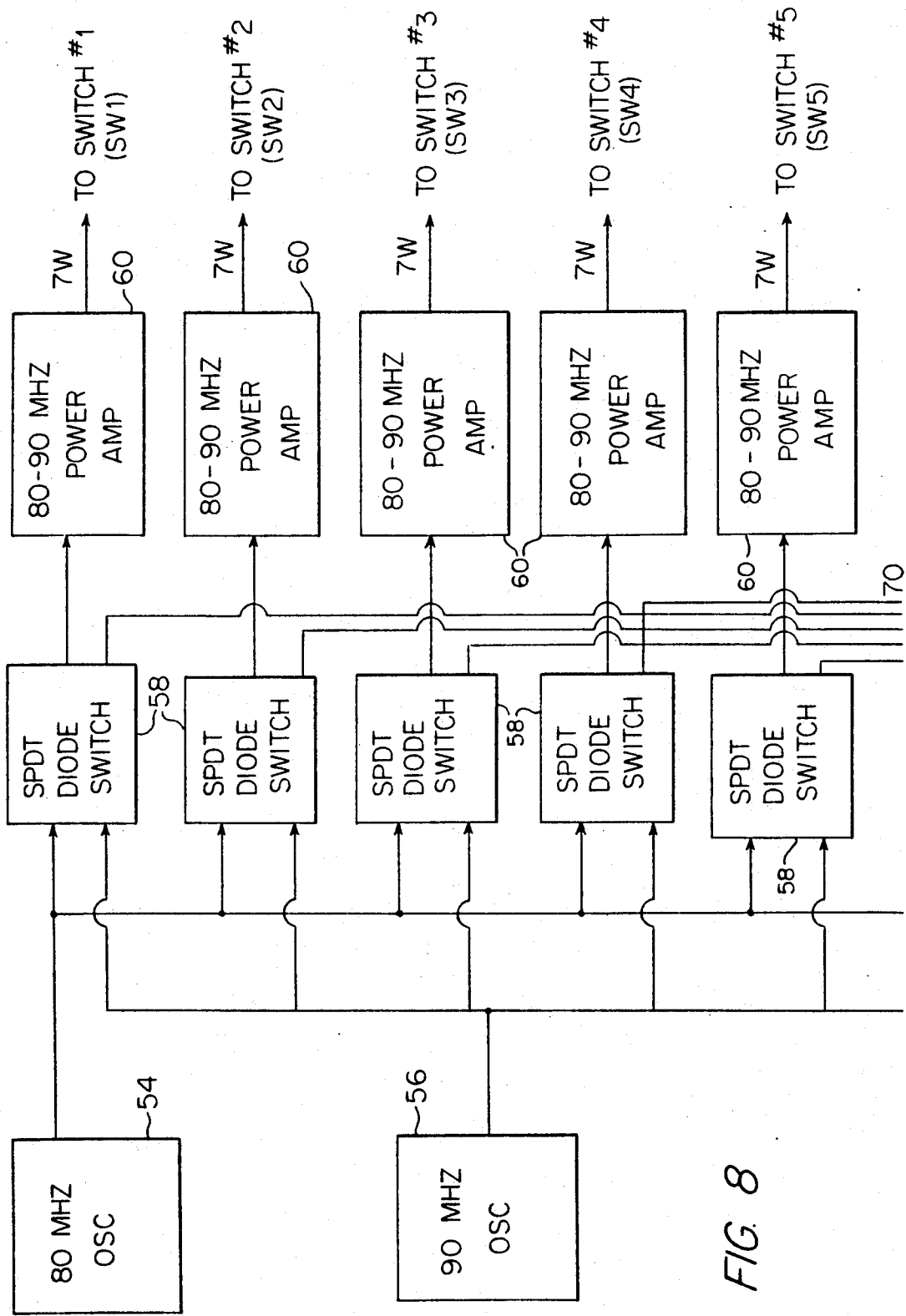
FIG. 8 is a schematic circuit diagram of a control system which may be utilized to control the PIN diodes of FIG. 6 or FIG. 7.

With reference to FIG. 8, the operation of the switching logic to control the switches of the circuits of FIGS. 6 or 7 may include plural single pole-double throw switches 58. The signals from the 80 Mhz oscillator 54 and the 90 Mhz oscillator 56 are both provided to the diode switches 58. The operation of the single pole-double throw diode switch 58 is controlled by one or more control lines 70 which may be connected to digital logic or a microprocessor which selects the various switch settings depending upon the needs of the circuit. Whichever of the signals is provided from the SPDT diode switches 58 are subsequently amplified by the power amps 60 and then carried, preferably through coax cable 62 to the switch modules located near the elements being switched.

While preferred embodiments of the present invention has been described, it is to be understood that the embodiments described are illustrative only and that the scope of the invention is to be defined solely by the appended claims when accorded a full range of equivalence, many variations and modifications naturally occurring to those skilled in the art from a perusal hereof.

I claim:

1. A PIN diode switch comprising:
   plural PIN diodes each having an anode connected to the anode of another of said PIN diodes;
   plural filter means, each filter means being responsive to one of plural frequencies;
   plural VHF signal rectifier means, each rectifier means operatively connected to one of said plural filter means, and producing a predetermined bias voltage in response to an input signal; and,
   bias selection means for applying a selected predetermined bias voltage to the anodes of said plural diodes;
   so that upon the application of a VHF signal having a frequency corresponding to one of said plural frequencies to the plural filter means, a selected one of said predetermined bias voltages is applied to the anodes of the plural PIN diodes to selectively enable signal conduction across the PIN diodes.

2. A method for activating plural, interconnected PIN diodes to selectively conduct RF signals comprising the steps of:
   generating plural VHF signals, each signal having a separate fundamental frequency, and being associated with a predetermined bias signal;
   applying a selected one of the generated VHF signals to a rectifier;
   rectifying the applied VHF signal to produce a signal equal to the predetermined bias signal associated with the applied VHF signal;
   supplying the rectified signal to one or more of the plural PIN diodes to selectively activate the one or more of the plural PIN diodes into conduction.

3. The pin diode switch of claim 1 wherein said filter means includes a capacitor and an inductor connected in series to one another and to one of said VHF signal rectifier means.

4. The pin diode switch of claim 1 further comprising transformer means operatively connected to the applied VHF signal for providing the selected one of said predetermined bias voltages.

5. The pin diode switch of claim 1 further comprising plural transistors, each operatively connected across the output terminals of said plural rectifiers means.

6. The pin diode switch of claim 1 wherein said plural rectifier means comprise one or more power sources.

* * * * *